United States Patent [19]

Moore et al.

[11] 4,427,316
[45] Jan. 24, 1984

[54] STACKING DEVICE FOR PRINTED CIRCUIT BOARDS

[75] Inventors: Jerry L. Moore, Harrisburg; Attalee S. Taylor, Palmyra, both of Pa.

[73] Assignee: AMP Incorporated, Harrisburg, Pa.

[21] Appl. No.: 397,948

[22] Filed: Jul. 14, 1982

[51] Int. Cl.³ .................. F16B 1/00; F16D 9/00
[52] U.S. Cl. ........................ 403/2; 403/407; 174/138 D; 361/418; 361/419
[58] Field of Search ............ 174/138 D; 361/413, 361/418, 419, 420; 411/907, 908; 403/406, 407, 2, 3, 4

[56] References Cited

U.S. PATENT DOCUMENTS 2,855,206 10/1958 Haviland ................ 174/138 D UX
3,029,486 4/1962 Raymond ................ 174/138 D UX
3,854,374 12/1974 Boyle et al. ................ 174/138 D X

FOREIGN PATENT DOCUMENTS 1239607 7/1960 France ................ 411/908

*Primary Examiner*—Andrew V. Kundrat
*Attorney, Agent, or Firm*—Allan B. Osborne

[57] ABSTRACT

The invention disclosed relates to a device for stacking printed circuit boards one on top of another. More particularly, the device includes a section for mounting the device in a hole in the board, an upper section extending above the board and having an upwardly open hole and a lower section extending below the board for insertion into an upwardly open hole in a device carried by the underlying board.

4 Claims, 3 Drawing Figures

STACKING DEVICE FOR PRINTED CIRCUIT BOARDS

BACKGROUND OF THE INVENTION

1. Field of the Invention

The present invention relates to non-conductive devices for stacking printed circuit boards one on top of another with a space therebetween.

2. Prior Art

All States Plastic Manufacturing Company of Chicago, Ill. makes a pluggable printed circuit board support which has means at each end to lock the support into the board. The means include either a self-locking style or a tension retaining style, both of which provide exceptional holding power and assure proper alignment of component boards. The supports are available in twelve spacing heights in either natural nylon or fire retardant nylon. No tools are required for installation or removal of either style. The support is disclosed in U.S. Pat. No. 4,143,577.

SUMMARY OF THE INVENTION

The invention disclosed herein comprises a device which cooperates with like devices so that printed circuit boards may be stacked. The device has an intermediate section, beginning with a downwardly facing shoulder immediately above a cylindrical portion. The cylindrical portion is received in the hole in the board. Directly below the cylindrical portion is a portion having an outwardly flaring surface with a very shallow slope to impede but not prevent the withdrawal of the device from the board. The lower end of the intermediate section is a frustum the wall of which converges downwardly to join the lower section of the device. The lower section has a number of segments which may be broken off to shorten the length of that section. The upper section of the device is an enlarged annular body having an upwardly open hole therein which receives the lower section of a device mounted in an overlying board.

DESCRIPTION OF THE INVENTION

Figure 1:
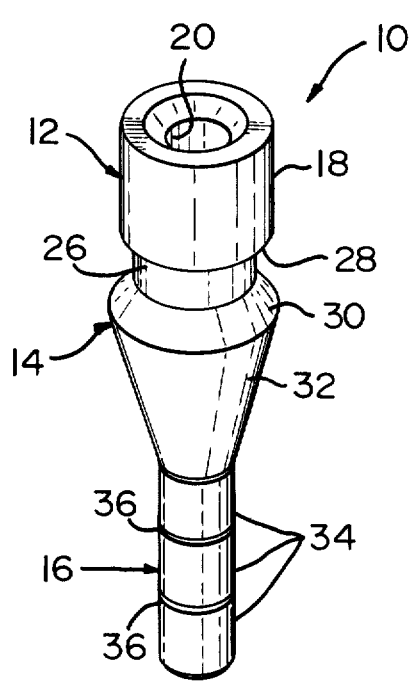
FIG. 1 is a perspective view of a device made in accordance with the preferred embodiment of the present invention.

Device 10 shown in the drawings is preferrably molded, using a plastic such as nylon. The primary material consideration includes one having a substantial degree of rigidity without being brittle.

With specific reference to FIG. 1, the several sections of device 10 include upper section 12, intermediate section 14 and lower section 16.

Figure 2:
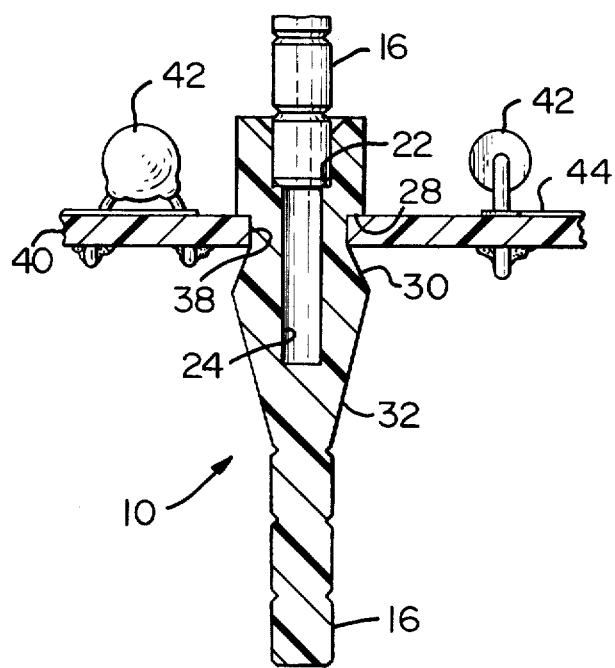
FIG. 2 is a cross-sectional, side view of the device of FIG. 1 showing it mounted in a printed circuit board and further receiving the lower section of a device mounted in an overlying board.

Upper section 12 has an enlarged annular portion 18 in which an upwardly open hole 20 is provided. With reference to FIG. 2, it can be seen that the hole diameter is reduced to form an upwardly facing annular rim 22. The reduced diameter hole, indicated by reference numeral 24, continues downwardly through most of the intermediate section.

Referring back to FIG. 1, intermediate section 14 includes a cylindrical portion 26 of reduced diameter. It is bounded above by downwardly facing annular shoulder 28 and below by an outwardly flaring portion 30. Frustum 32 converges downwardly from portion 30 to its attachment with lower section 16.

Lower section 16 consists of several cylindrical segments 34 defined by score lines 36.

The cross-sectional drawing in FIG. 2 shows device 10 mounted in hole 38 in printed circuit board 40. The board has electronic components 42 mounted thereon and electrically connected to conductive traces 44, all in known fashion.

The device was mounted in hole 38 by inserting it thereinto with lower portion 16 leading. As frustum 32 encountered the wall defining hole 38, the diameter of the frustum decreases by reason of the material moving resiliently into hole 24. The device is mounted in the board with cylindrical portion 26 in hole 38 and downwardly facing annular shoulder 28 resting or abutting the top surface of board 40. The longitudinal length of cylindrical portion 26 is preferably slightly smaller than the thickness of the hole so that there is an interference fit between shoulder 28 and flaring portion 30; thus the cylindrical portion would be under tension.

Device 10 may be removed from the circuit board by pulling it back out of hole 38. The relative shallow outwardly flaring portion 30, however, is less amenable to being reduced circumferentially than the steeper sloped frustum 32. Accordingly, the device is fairly easy to insert into the board, cannot vibrate out or become loose in the hole, and can be withdrawn, but with some difficulty.

FIG. 2 also illustrates the stackability of one device 10 into another device 10. Lower portion 16 of the above device is received in hole 20 of the lower device. The relative diameters of the lower section and hole provides an interference fit. As shown, the received lower section rests on upwardly facing 22 in hole 20.

Figure 3:
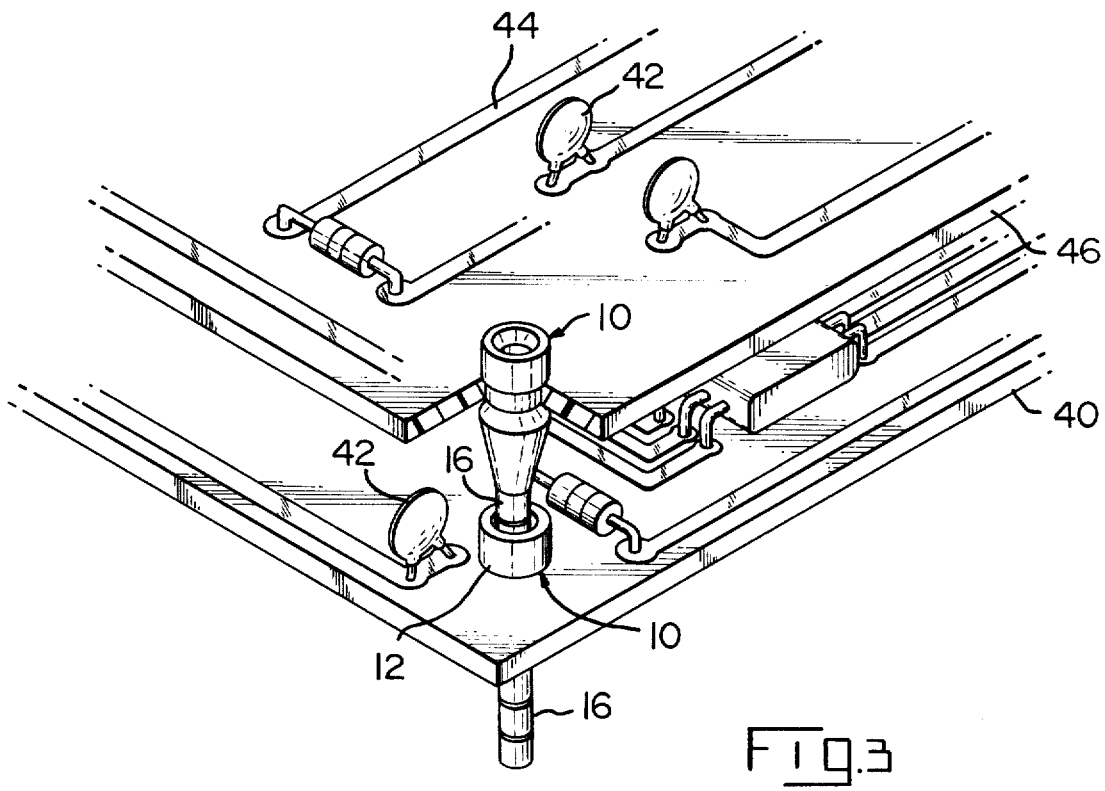
FIG. 3 is a perspective view showing two printed circuit boards stacked one on top of another by means of devices of the present invention.

FIG. 3 shows a second printed circuit board 46 stacked on top of board 40 by use of devices 10, one positioned in each corner of each board. The space between boards is controlled by simply removing segments 34 from the lower section on the devices positioned in the overlying board.

We claim:

1. A device for use with printed circuit boards so that the boards may be stacked one above another, said device comprising an elongated body of resilient material and including:
   a. an upper section adapted to extend above the board into which the device is mounted;
   b. an intermediate section including a cylindrical portion at the upper end, a frustum defining the lower end with the convergence being downwardly, and an outwardly flaring portion therebetween,
   c. an upwardly open hole extending downwardly into the elongated body; and
   d. a cylindrical lower section having a number of break-away segments in tandem, said lower section being adapted to be inserted into the upwardly open hole in a like device mounted on an underlying board.

2. The device of claim 1 wherein the hole extends downwardly into the frustum so that the frustum may be resiliently, circumferentially reduced.

3. The device of claim 2 wherein the slope of the outwardly flaring portion is substantially less steep than the degree of convergence of the frustum.

4. The device of claim 3 wherein a downwardly facing shoulder adjacent the cylindrical portion is provided by the upper section, said shoulder being adapted to abut the upper surface of the board in which the device may be mounted.

* * * * *